(12) United States Patent
Yeh et al.

(10) Patent No.: US 11,737,214 B2
(45) Date of Patent: Aug. 22, 2023

(54) ELECTRONIC DEVICE

(71) Applicant: Innolux Corporation, Miao-Li County (TW)

(72) Inventors: Chen-Lin Yeh, Miao-Li County (TW); Ming-Sheng Lai, Miao-Li County (TW); Yan-Zheng Wu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/535,572

(22) Filed: Nov. 25, 2021

(65) Prior Publication Data

US 2022/0201864 A1   Jun. 23, 2022

Related U.S. Application Data

(60) Provisional application No. 63/129,498, filed on Dec. 22, 2020.

(30) Foreign Application Priority Data

Nov. 9, 2021   (CN) .......................... 202111320310.8

(51) Int. Cl.
*H05K 1/18*    (2006.01)
*H01Q 3/28*    (2006.01)
(Continued)

(52) U.S. Cl.
CPC .............. *H05K 1/181* (2013.01); *H01Q 3/28* (2013.01); *H01Q 3/34* (2013.01); *H05K 1/0219* (2013.01);
(Continued)

(58) Field of Classification Search
CPC ....................................................... H05K 1/181
(Continued)

(56) References Cited

U.S. PATENT DOCUMENTS

| 6,552,696 B1 * | 4/2003 | Sievenpiper | H01Q 3/44 343/754 |
| 6,919,862 B2 * | 7/2005 | Hacker | H01Q 15/008 333/248 |

(Continued)

FOREIGN PATENT DOCUMENTS

| CN | 101176390 | 5/2008 |
| JP | 2006261801 | * 9/2006 |

OTHER PUBLICATIONS

"Search Report of Europe Counterpart Application", dated Jun. 22, 2022, p. 1-p. 8.

(Continued)

*Primary Examiner* — Stanley Tso
(74) *Attorney, Agent, or Firm* — JCIPRNET

(57) ABSTRACT

An electronic device includes a substrate, a plurality of conductive patterns, and a tunable element. A plurality of conductive patterns are disposed on the substrate. The tunable element is disposed on at least one conductive pattern in the plurality of conductive patterns and includes a first pad, a second pad, and a third pad. The first pad, the second pad, and the third pad are separated from each other. The first pad and the second pad are overlapped with the at least one conductive pattern in the plurality of conductive patterns. The third pad is disposed between the first pad and the second pad.

11 Claims, 14 Drawing Sheets

(51) Int. Cl.
*H01Q 3/34* (2006.01)
*H05K 1/02* (2006.01)

(52) U.S. Cl.
CPC ............... *H05K 2201/1003* (2013.01); *H05K 2201/10015* (2013.01); *H05K 2201/10022* (2013.01); *H05K 2201/10106* (2013.01); *H05K 2201/10166* (2013.01); *H05K 2201/10196* (2013.01); *H05K 2201/10522* (2013.01); *H05K 2201/10636* (2013.01); *H05K 2201/10674* (2013.01)

(58) Field of Classification Search
USPC ......................................................... 361/777
See application file for complete search history.

(56) References Cited

U.S. PATENT DOCUMENTS

| | | | | |
|---|---|---|---|---|
| 2005/0046523 | A1* | 3/2005 | Wu ...................... | H01P 1/2005 333/209 |
| 2015/0270820 | A1* | 9/2015 | Cherif ................... | H01P 1/2039 333/205 |
| 2015/0380828 | A1* | 12/2015 | Black ..................... | H01Q 23/00 343/904 |
| 2016/0329880 | A1* | 11/2016 | Gao ....................... | H02H 9/046 |
| 2020/0075503 | A1* | 3/2020 | Chuang ................ | H01Q 1/2283 |
| 2021/0050671 | A1 | 2/2021 | Stevenson et al. | |

OTHER PUBLICATIONS

"Office Action of Taiwan Counterpart Application", dated Oct. 3, 2022, p. 1-p. 9.

* cited by examiner

12J

12M

12K

12N

12L

12O

ELECTRONIC DEVICE

CROSS-REFERENCE TO RELATED APPLICATION

This application claims the priority benefit of U.S. application Ser. No. 63/129,498, filed on Dec. 22, 2020, and China application serial no. 202111320310.8, filed on Nov. 9, 2021. The entirety of each of the above-mentioned patent applications is hereby incorporated by reference herein and made a part of this specification.

BACKGROUND

Technical Field

The disclosure relates to an electronic device.

Description of Related Art

Radio frequency (RF) devices in electronic devices are configured to transmit or receive electromagnetic waves, so they are an indispensable part of wireless communication techniques. How to increase the flexibility of circuit design, increase tunable RF parameters, or adjust the radiation direction of electromagnetic waves is one of the research and development focuses of researchers in the art.

SUMMARY

The disclosure provides an electronic device that helps increase the flexibility of circuit design, increase tunable RF parameters, or adjust the transmission direction of electromagnetic waves.

According to an embodiment of the disclosure, an electronic device includes a substrate, a plurality of conductive patterns, and a tunable element. A plurality of conductive patterns are disposed on the substrate. The tunable element is disposed on at least one conductive pattern in the plurality of conductive patterns and includes a first pad, a second pad, and a third pad. The first pad, the second pad, and the third pad are separated from each other. The first pad and the second pad are overlapped with the at least one conductive pattern in the plurality of conductive patterns. The third pad is disposed between the first pad and the second pad.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
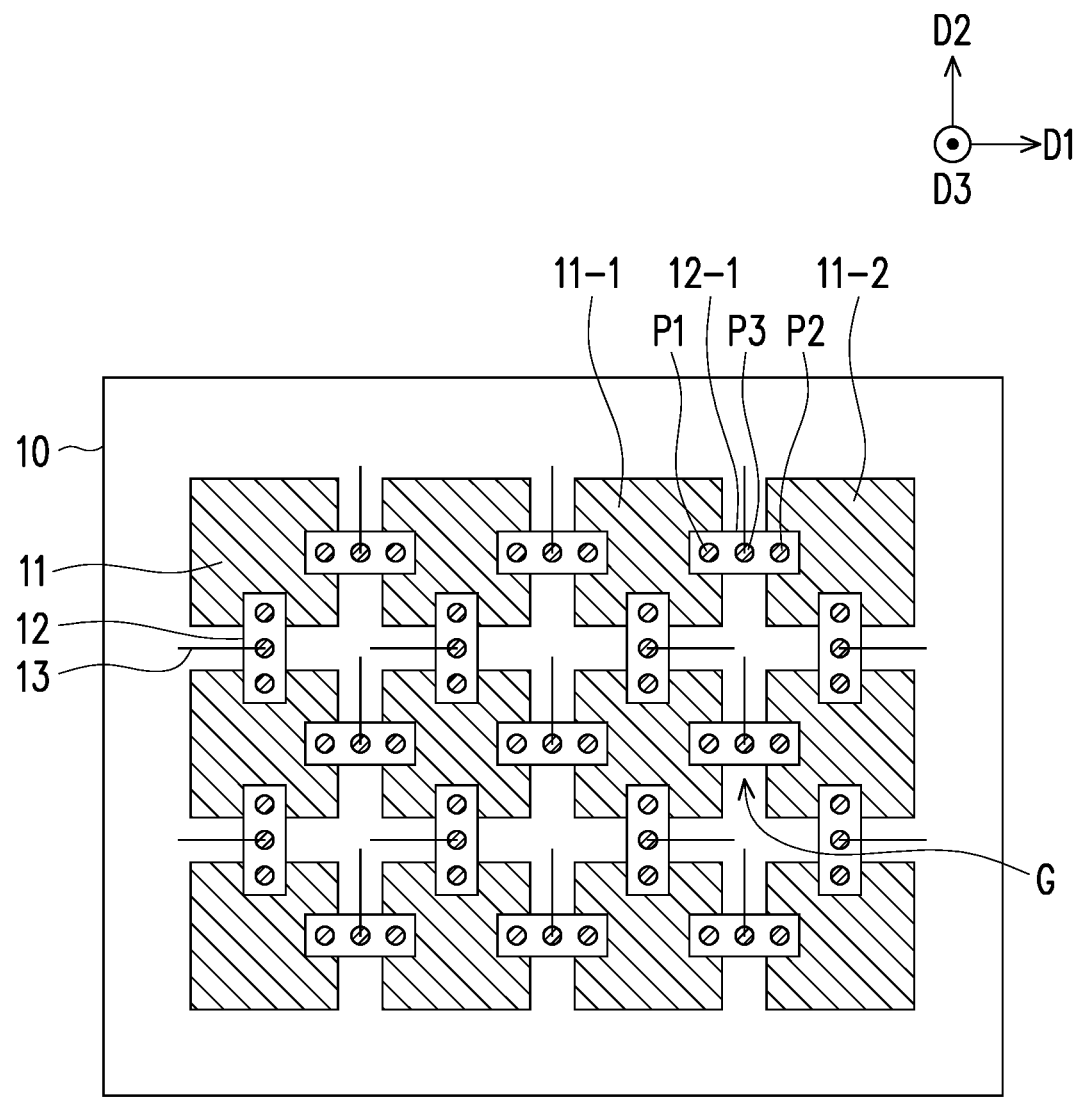
FIG. 1 to FIG. 3 are schematic partial top views of electronic devices according to the first embodiment to the third embodiment of the disclosure, respectively.

The disclosure may be understood by referring to the following detailed description in conjunction with the accompanying figures. It should be noted that, in order to facilitate the reader's understanding and the simplicity of the figures, the multiple figures in the disclosure shows a portion of the electronic device/display device, and the specific elements in the figures are not drawn according to actual scale. In addition, the number and size of each element in the figures are for illustration, and are not used to limit the scope of the disclosure. For example, the relative size, thickness, and location of layers, regions, or structures may be reduced or enlarged for clarity.

Throughout the disclosure, certain words are used to refer to specific elements in the specification and the claims. Those skilled in the art should understand that electronic equipment manufacturers may refer to the same elements by different names. The present specification does not intend to distinguish between elements that have the same function but different names. In the following description and claims, the words "have" and "include" and the like are open-ended words, and therefore should be interpreted as "including but not limited to . . . "

In the present specification, wordings used to indicate direction, such as "up," "down," "front," "back," "left," and "right", merely refer to directions in the drawings. Therefore, the directional terms are used to illustrate and are not intended to limit the disclosure. It should be understood that, when an element or film layer is said to be disposed "on" or "connected" to another element or film layer, the element or film layer may be directly on the other element or film layer or directly connected to the other element or film layer, or there may be an intervening element or film layer between the two (indirect connection). Conversely, when an element or film layer is said to be "directly" on or "directly connected" to another element or film layer, there is no intervening element or film layer between the two.

The terms "about", "equal to", "equal", "same", "substantially", or "essentially" mentioned in the present specification usually represent falling within 10% range of a given value, or means falling within 5%, 3%, 2%, 1%, or 0.5% range of a given value. In addition, unless otherwise specified, the terms "the given range is from a first value to a second value" and "the given value falls within the range of a first value to a second value" both mean the given range includes the first value, the second value, and other values in between.

In some embodiments of the disclosure, terms such as "connection", "interconnection", etc. regarding joining and connection, unless specifically defined, may mean that two structures are in direct contact, or that two structures are not in direct contact, wherein there are other structures located between these two structures. Terms related to joining and connecting may also include the case where both structures are movable or both structures are fixed.

In addition, the term "electrical connection" may include any direct or indirect electrical connection means. For example, "direct electrical connection" may mean that two elements are in direct contact and electrically connected, or two elements may be connected in series via one or a plurality of conductive elements; and "indirect electrical connection" may mean that two elements are separated from each other, and there is no other conductive element between the two elements to connect the two together in series.

In the following embodiments, the same or similar devices are designated by the same or similar reference numerals, and the description thereof is omitted. Moreover, the features in different embodiments may be mixed and matched arbitrarily as long as they do not violate the spirit of the disclosure or conflict with each other. In addition, simple equivalent changes and modifications made in accordance with the present specification or claims are still within the scope of the disclosure. Moreover, terms such as "first" and "second" as used in this specification or the claims are used to identify different elements or to distinguish different embodiments or ranges, and are not intended to limit the upper limit or the lower limit of the number of elements and are also not intended to limit the order of manufacture of the elements or the order in which the elements are arranged.

The electronic device disclosed in the disclosure may include a display device, a backlight device, a radio frequency (RF) device, a sensing device, or a tiling device, but the disclosure is not limited thereto. The electronic device may be a bendable or flexible electronic device. The display device may be a non-self-luminous display device or a self-luminous display device. The RF device may include a frequency selective surface (FSS), an electromagnetic band gap (EBG) structure, an RF-filter, a polarizer, a resonator, or an antenna, etc. The antenna may be a liquid-crystal antenna or a non-liquid-crystal antenna. The sensing device may be a sensing device sensing capacitance, light, heat, or ultrasound, but the disclosure is not limited thereto. The tiling device may be, for example, a display tiling device or an RF tiling device, but the disclosure is not limited thereto. It should be noted that the electronic device may be any arrangement and combination of the above, but the disclosure is not limited thereto. Hereinafter, the RF device is used as an electronic device to explain the disclosure, but the disclosure is not limited thereto.

Figure 2:
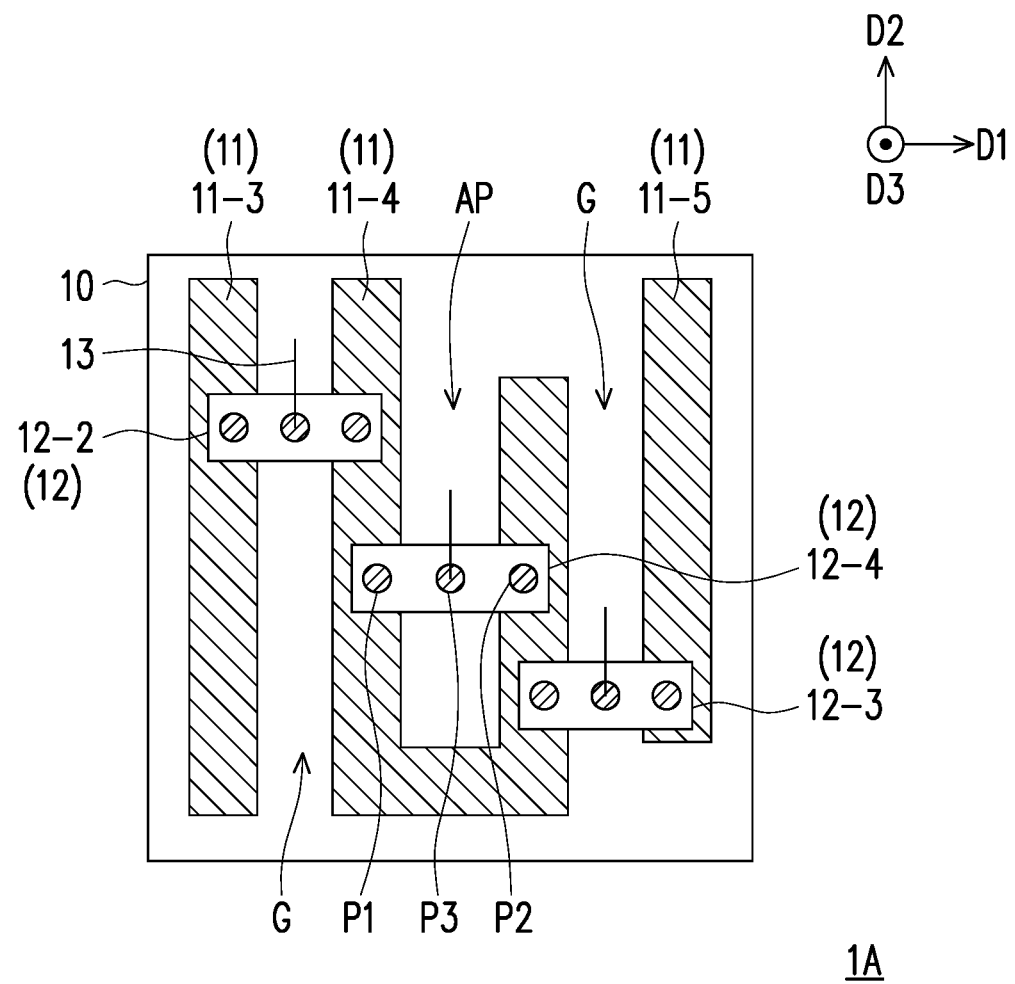
Figure 3:
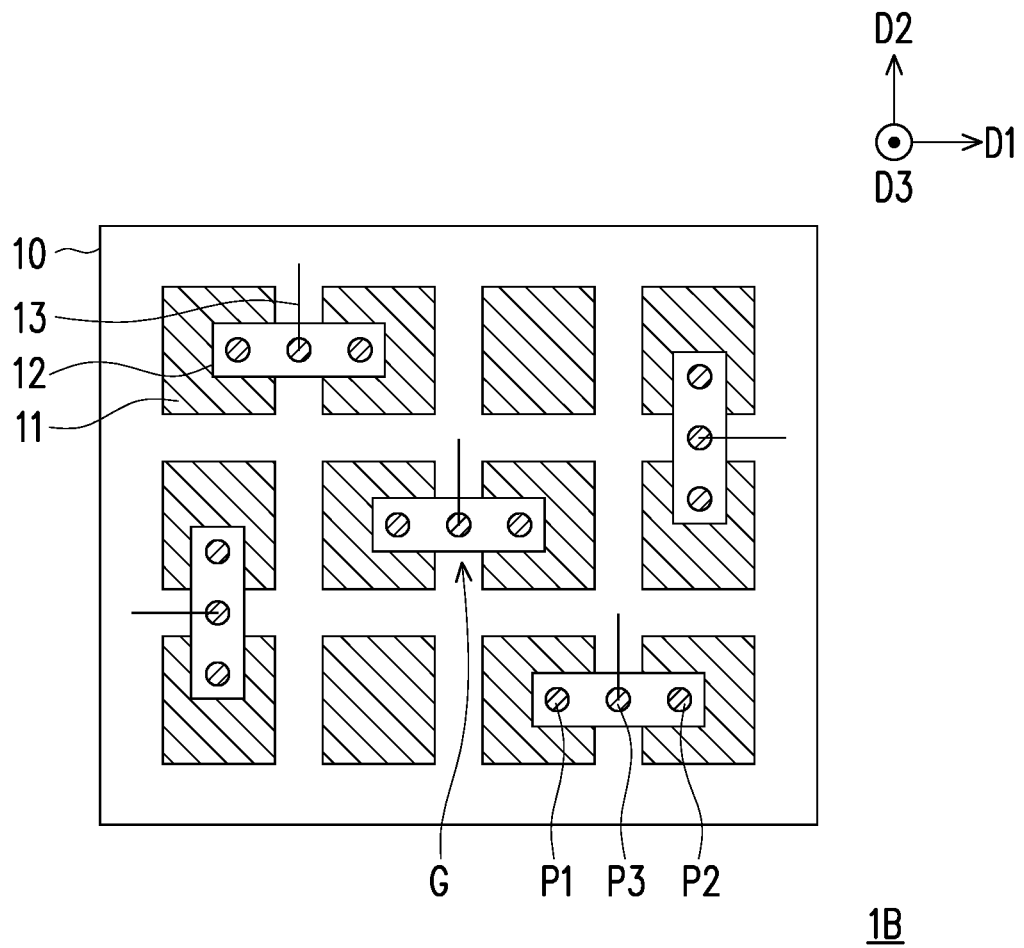

FIG. 1 to FIG. 3 are schematic partial top views of electronic devices according to the first embodiment to the third embodiment of the disclosure, respectively.

Please refer to FIG. 1, an electronic device 1 may include a substrate 10, a plurality of conductive patterns 11, and a tunable element 12. The plurality of conductive patterns 11 are disposed on the substrate 10. The tunable element 12 is disposed on at least one conductive pattern 11 in the plurality of conductive patterns 11 and includes a first pad P1, a second pad P2, and a third pad P3. The first pad P1, the second pad P2, and the third pad P3 are separated from each other. The first pad P1 and the second pad P2 are overlapped with the at least one conductive pattern 11 in the plurality of conductive patterns 11. The third pad P3 is disposed between the first pad P1 and the second pad P2.

In detail, the substrate 10 may be configured to carry elements. In some embodiments, the substrate 10 may also be used as a waveguide structure transmitting electromagnetic waves, but the disclosure is not limited thereto. In other embodiments, the waveguide structure may be replaced by a transmission line or free space. The substrate 10 may be a rigid substrate or a flexible substrate. For example, the material of the substrate 10 may include glass, a polymer film (such as a polyimide film), a printed circuit board, or a combination of the above, but the disclosure is not limited thereto.

The plurality of conductive patterns 11 may be configured to provide electrical signals to one or a plurality of corresponding tunable elements 12. In some embodiments, the plurality of conductive patterns 11 may be further configured to limit the output area of electromagnetic waves transmitted under the plurality of conductive patterns 11. For example, electromagnetic waves may be output from areas not covered by the plurality of conductive patterns 11. For example, the material of the plurality of conductive patterns 11 may include copper, aluminum, silver, gold, any material with high conductivity, or a combination of the above, but the disclosure is not limited thereto.

FIG. 1 schematically shows twelve conductive patterns 11. The top view shape of each of the conductive patterns 11 is, for example, a square. The twelve conductive patterns 11 are arranged in an array in a first direction D1 and a second direction D2. The first direction D1 and the second direction D2 are intersected with each other and both are perpendicular to the thickness direction of the substrate 10 (such as a third direction D3). The first direction D1 and the second direction D2 may be perpendicular to each other, but are not limited thereto. There is a gap G between any two adjacent conductive patterns 11 in the first direction D1 or the second direction D2.

Each of the tunable elements 12 may be disposed to traverse one corresponding gap G. For example, the extending direction of the tunable elements 12 (such as the arrangement direction of the first pad P1, the second pad P2, and the third pad P3) is intersected with the extending direction of the gap G. In some embodiments, the extending direction of the tunable elements 12 may be perpendicular to the extending direction of the gap G, but the disclosure is not limited thereto.

FIG. 1 schematically shows seventeen tunable elements 12. The top view shape of each of the tunable elements 12 is, for example, a rectangle. The first pad P1 and the second pad P2 of each of the tunable elements 12 may be overlapped with two conductive patterns 11 located at two sides of the gap G, respectively, and the first pad P1 and the second pad P2 may be electrically connected to the two conductive patterns 11 respectively. In some embodiments, the electronic device 1 may further include a signal line 13. The signal line 13 is disposed on the substrate 10 and is electrically connected to the third pad P3 of the tunable elements 12 to provide an electrical signal to the third pad P3 of the tunable elements 12. The materials of the first pad P1, the second pad P2, and the third pad P3 of the tunable elements 12 may include nickel gold, nickel palladium gold, silver, gold, nickel, tin, organic solderability preservative (OSP), other conductive materials, or a combination of the above, but the disclosure is not limited thereto. The material of the signal line 13 may include copper, aluminum, silver, gold, any material with high conductivity, or a combination of the above, but the disclosure is not limited thereto.

Taking FIG. 1 as an example, a conductive pattern 11-1 and a conductive pattern 11-2 in the twelve conductive patterns 11 are arranged in the first direction D1. A tunable element 12-1 is disposed to traverse the gap G between the conductive pattern 11-1 and the conductive pattern 11-2, wherein the first pad P1, the second pad P2, and the third pad P3 of the tunable element 12-1 are overlapped with the conductive pattern 11-1, the conductive pattern 11-2, and the signal line 13 in the third direction D3, respectively, and the first pad P1, the second pad P2, and the third pad P3 are electrically connected to the conductive pattern 11-1, the conductive pattern 11-2, and the signal line 13, respectively.

It should be understood that, the respective shapes, numbers, arrangements, relative arrangement relationships and the like of the conductive patterns 11, the tunable elements 12, and the signal line 13 in the electronic device 1 may be changed according to actual needs, and are not limited to those shown in FIG. 1. In addition, in some embodiments, the electronic device 1 may include a defect ground structure (DGS), but the disclosure is not limited thereto.

The tunable elements 12 may include a capacitor, a resistor, an inductor, a diode, a transistor, a microelectromechanical system, or a combination thereof. The relevant parameters of the tunable element may be tuned by the signal applied to the tunable element. Related parameters may include dielectric constant, area, width of depletion region of semiconductor, height of metal plate, etc., but the disclosure is not limited thereto. In some embodiments, the tunable elements 12 may package the tunable members using techniques such as panel-level packaging (PLP), wafer-level packaging (WLP), or fan-out wafer-level packaging (FOWLP). In some embodiments, the tunable elements 12 may be bonded to one or a plurality of corresponding conductive patterns 11 and/or signal lines 13 via a method such as direct bonding, micro bonding, or flip-chip bonding.

In the present embodiment, the tunable elements 12 may include a variable capacitor. The variable capacitor may be formed by, for example, a liquid-crystal device, a varactor, or a microelectromechanical system (MEMS), but the disclosure is not limited thereto. By changing the voltage applied to the variable capacitor via the conductive patterns 11 and the signal line 13, the equivalent capacitance in the RF circuit may be controlled, so that the phase and amplitude of electromagnetic waves are changed accordingly, and the direction of the electromagnetic waves is controlled or the directivity of the RF device is improved. The design of the three pads (including the first pad P1, the second pad P2, and the third pad P3) of the tunable elements 12 may increase the flexibility of circuit design, increase tunable RF parameters (such as radiation intensity, resonance frequency, or phase), or adjust the transmission direction of electromagnetic waves.

Taking FIG. 1 as an example, the first pad P1 and the second pad P2 of each of the tunable elements 12 may be equipotential or grounded, the third pad P3 may have a greater potential than the first pad P1 and the second pad P2, and the capacitance value of the tunable elements 12 may be controlled by changing the potential of the third pad P3. In FIG. 1, a plurality of conductive patterns 11 may be commonly applied with a ground voltage, and seventeen third pads P3 of seventeen tunable elements 12 may be respectively applied with seventeen kinds of direct current voltages. In other words, the seventeen tunable elements 12 may have seventeen voltage degrees of freedom. Each of the tunable elements 12 may be independently controlled. Therefore, the tunable range (such as the scanning angle and the number of light beams) of the electronic device 1 may be larger. In other embodiments, the plurality of conductive patterns 11 may be applied with one or more DC voltage (for example, the conductive pattern 11-1 and the conductive pattern 11-2 may be applied with different DC voltages), and the plurality of third pads P3 of the plurality of tunable elements 12 may be applied with various DC voltages.

In some embodiments, the plurality of conductive patterns 11 and the plurality of signal lines 13 may be of different layers. In other embodiments, the plurality of conductive patterns 11 and the plurality of signal lines 13 may be of the same layer.

In some embodiments, a plurality of signal lines 13 may be dispersedly arranged to reduce the influence of the low-frequency varactor voltage control circuit loop on the RF characteristics of the conductive patterns 11. In some embodiments, the total width of a plurality of adjacent signal lines 13 may be made less than one-tenth of the RF wavelength, or the linewidth of each of the signal lines 13 may be made less than one-fifth of the width of the gap G between two adjacent conductive patterns 11, in order to reduce the influence of the stray capacitance between the signal lines 13 and the conductive patterns 11.

Please refer to FIG. 2, an electronic device 1A includes the substrate 10, a plurality of conductive patterns 11, a plurality of tunable elements 12, and a plurality of signal lines 13. The main difference between the electronic device 1A and the electronic device 1 in FIG. 1 lies in the respective shapes, numbers, arrangements, relative arrangement relationships and the like of the plurality of conductive patterns 11, the plurality of tunable elements 12, and the plurality of signal lines 13.

Moreover, in the electronic device 1A, a tunable element 12-2 traverses the gap G between adjacent conductive pattern 11-3 and conductive pattern 11-4 in the first direction D1, and the first pad P1 and the second pad P2 of the tunable element 12-2 are electrically connected to the conductive pattern 11-3 and the conductive pattern 11-4, respectively. A tunable element 12-3 traverses the gap G between adjacent conductive pattern 11-4 and conductive pattern 11-5 in the first direction D1, and the first pad P1 and the second pad P2 of the tunable element 12-3 are electrically connected to the conductive pattern 11-4 and the conductive pattern 11-5, respectively. The conductive pattern 11-4 has an opening AP, wherein a tunable element 12-4 is disposed to traverse the opening AP, and the first pad P1 and the second pad P2 of the tunable element 12-4 are electrically connected to the conductive patterns 11-4 at two sides of the opening AP.

Please refer to FIG. 3, an electronic device 1B includes the substrate 10, a plurality of conductive patterns 11, a plurality of tunable elements 12, and a plurality of signal lines 13. The main difference between the electronic device 1B and the electronic device 1 in FIG. 1 lies in the respective shapes, numbers, arrangements, relative arrangement relationships and the like of the plurality of conductive patterns 11, the plurality of tunable elements 12, and the plurality of signal lines 13. Specifically, in the electronic device 1B, the top view shape of each of the conductive patterns 11 is, for example, a rectangle, each of the tunable elements 12 is disposed to traverse the gap G between two adjacent conductive patterns 11, and the number of the plurality of tunable elements 12 is less than the number of the plurality of conductive patterns 11, for example.

Figure 4A:
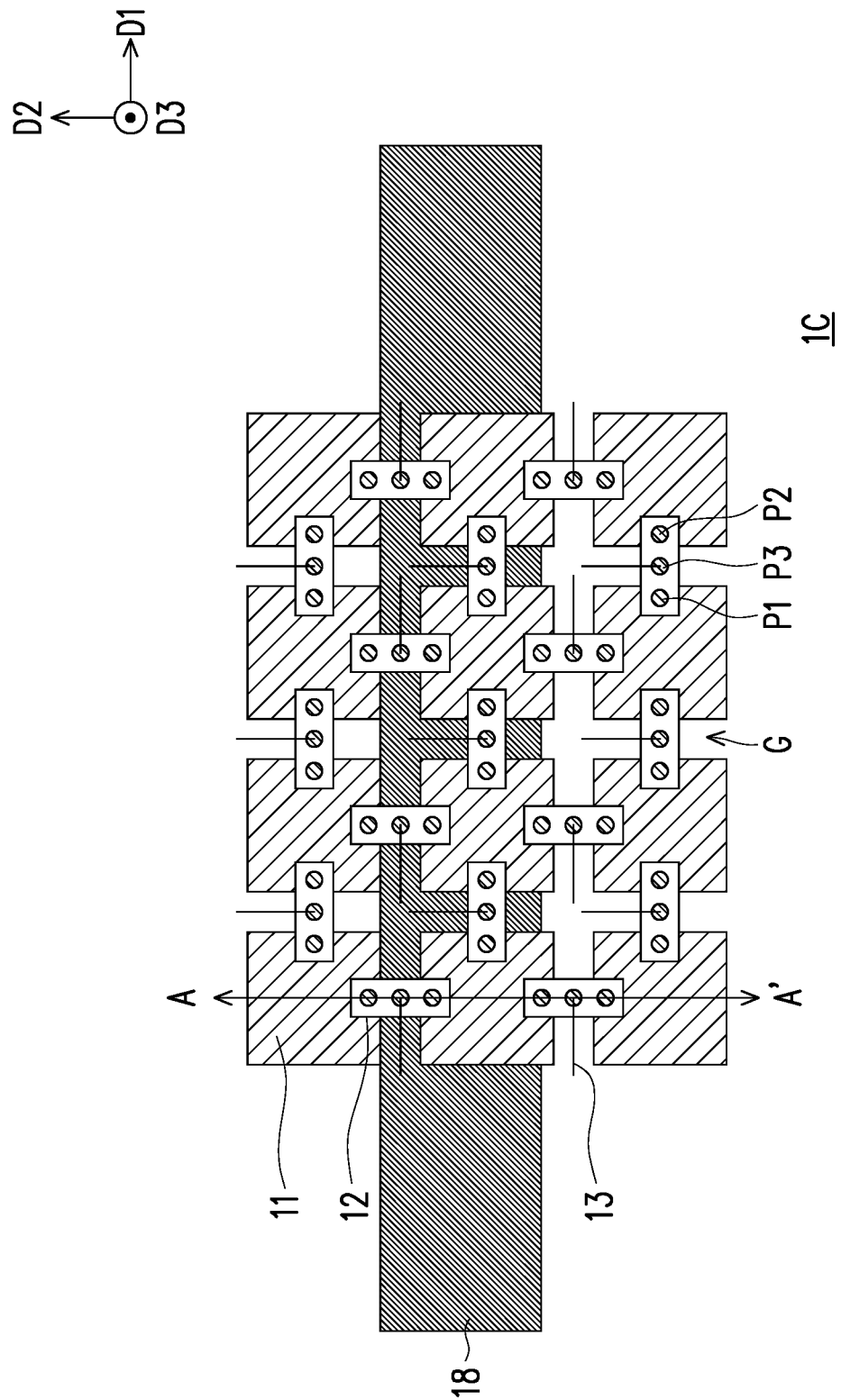
FIG. 4A and FIG. 4B are respectively a partial top schematic view and a partial cross-sectional schematic view of an electronic device according to the fourth embodiment of the disclosure.
Figure 4B:
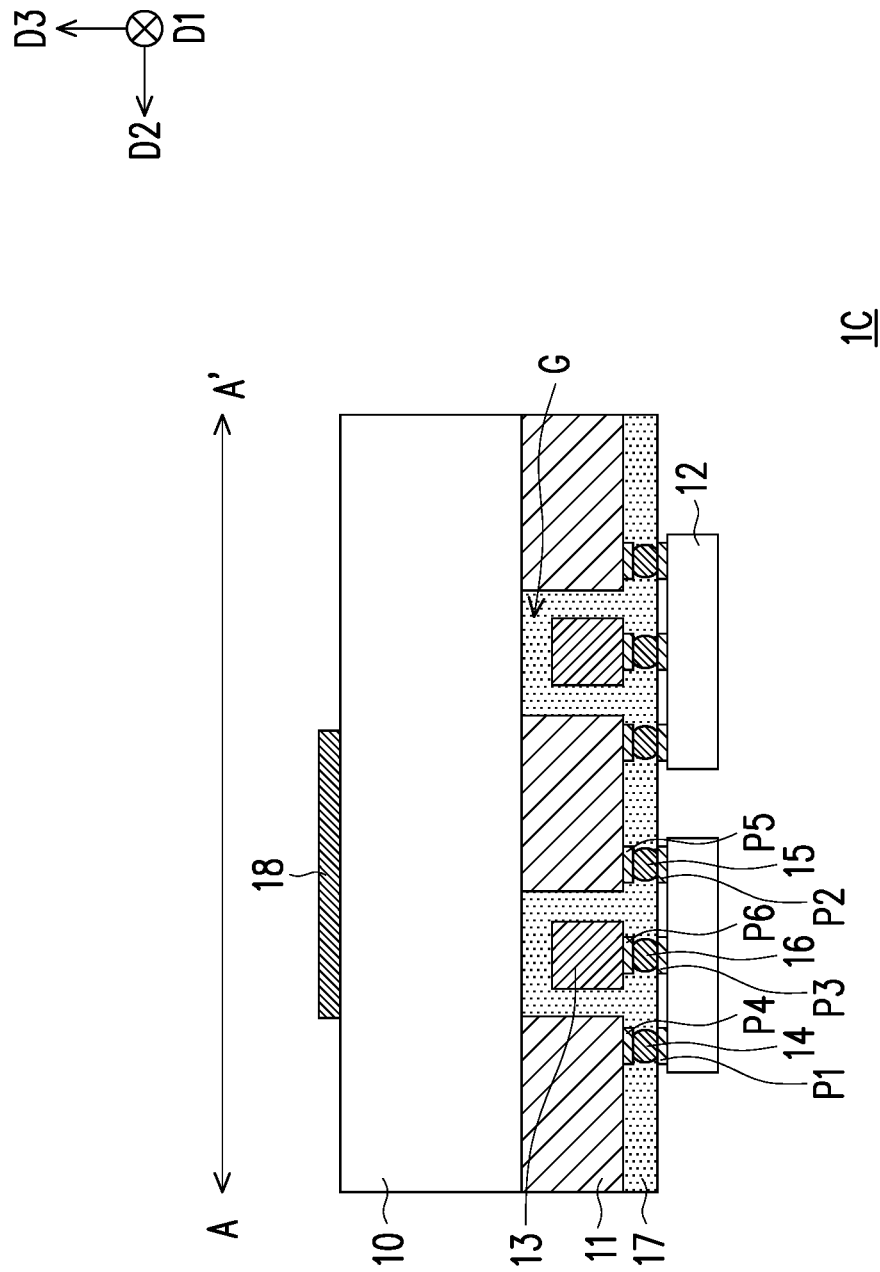

FIG. 4A and FIG. 4B are respectively a partial top schematic view and a partial cross-sectional schematic view of an electronic device according to the fourth embodiment of the disclosure. In order to clearly show the relative arrangement relationship of some elements and/or film layers, FIG. 4A omits showing some elements and/or film layers of the electronic device. In addition, please refer to FIG. 4B for the cross-section of section line A-A' in FIG. 4A.

Please refer to FIG. 4A and FIG. 4B. The main differences between an electronic device 1C and the electronic device 1 of FIG. 1 are described as follows. The electronic device 1C further includes a first solder 14, a second solder 15, and a third solder 16, wherein the first pad P1, the second pad P2, and the third pad P3 are directly electrically connected to two adjacent conductive patterns 11 and the signal lines 13 via the first solder 14, the second solder 15, and the third solder 16, respectively. As shown in FIG. 4B, the first pad P1, the second pad P2, and the third pad P3 are respectively connected to a pad P4, a pad P5, and a pad P6 on the signal lines 13 on the two adjacent conductive patterns 11 via the first solder 14, the second solder 15, and the third solder 16, respectively. In other words, the tunable elements 12 are directly electrically connected to the two adjacent conductive patterns 11 and the signal lines 13. The material of the first solder 14, the second solder 15, and the third solder 16 may include tin balls, copper pillars, other suitable metals or metal alloys, but the disclosure is not limited thereto. The material of the pad P4, the pad P5, and the pad P6 may include nickel gold, nickel palladium gold, silver, gold, nickel, tin, organic solder mask, other conductive materials, or a combination of the above, but the disclosure is not limited thereto.

In some embodiments, the electronic device 1C may further include an isolation layer 17. The isolation layer 17 is disposed on the substrate 10 and may cover the plurality of conductive patterns 11 and the plurality of signal lines 13. For example, the material of the isolation layer 17 may include silicon nitride (SiNx), silicon oxide (SiOx), silicon oxynitride (SiOxNy), epoxy resin, acrylic, solder resist, silicon material, bismaleimide, polyimide, or a combination of the above, but the disclosure is not limited thereto.

In some embodiments, the electronic device 1C may further include a transmission line 18. The transmission line 18 is disposed on the substrate 10, and the substrate 10 is located between the transmission line 18 and the plurality of conductive patterns 11, for example. In other words, the transmission line 18 and the plurality of conductive patterns 11 are respectively disposed on opposite sides of the substrate 10.

In the present embodiment, electromagnetic waves may be transmitted via the transmission line 18, the plurality of conductive patterns 11 may be connected to the ground voltage, and the direct current signal applied to the signal lines 13 may be controlled to allow electromagnetic waves in a specific frequency range to pass and to filter electromagnetic waves in other frequency ranges. For example, electromagnetic waves in a specific frequency range may be radio frequencies, millimeter waves, terahertz (THz), infrared light, visible light, or the like, but the disclosure is not limited thereto.

Figure 5A:
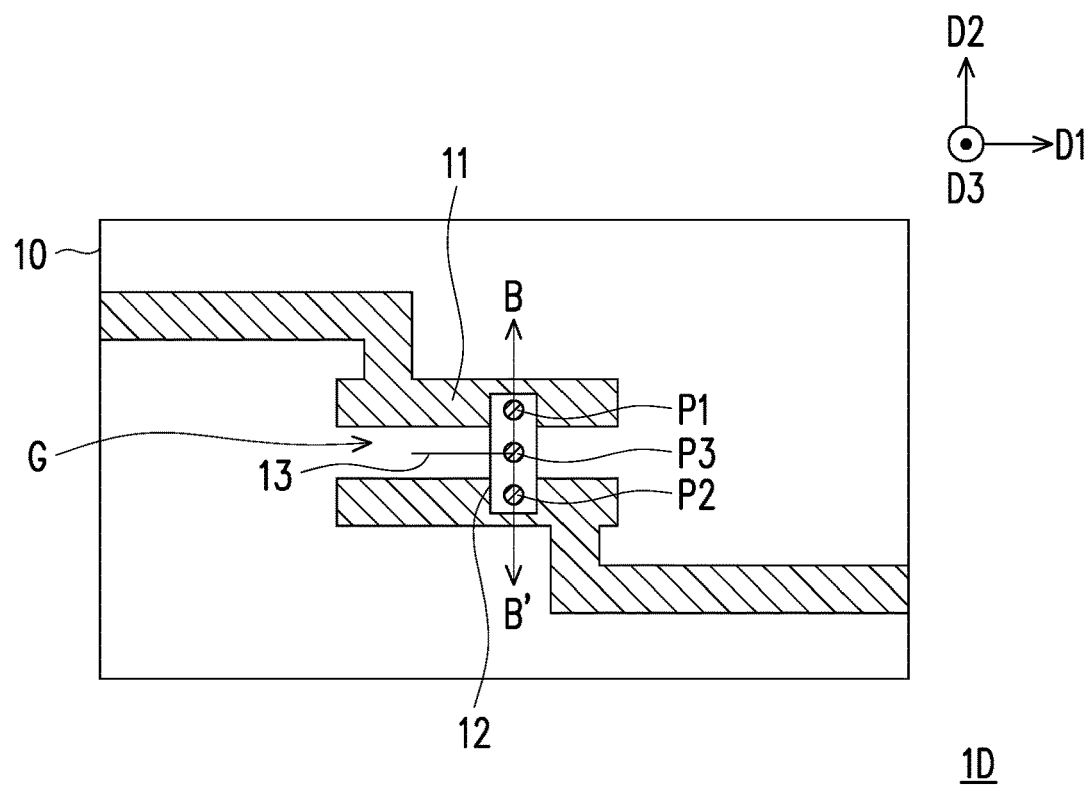
FIG. 5A and FIG. 5B are respectively a partial top schematic view and a partial cross-sectional schematic view of an electronic device according to the fifth embodiment of the disclosure.
Figure 5B:
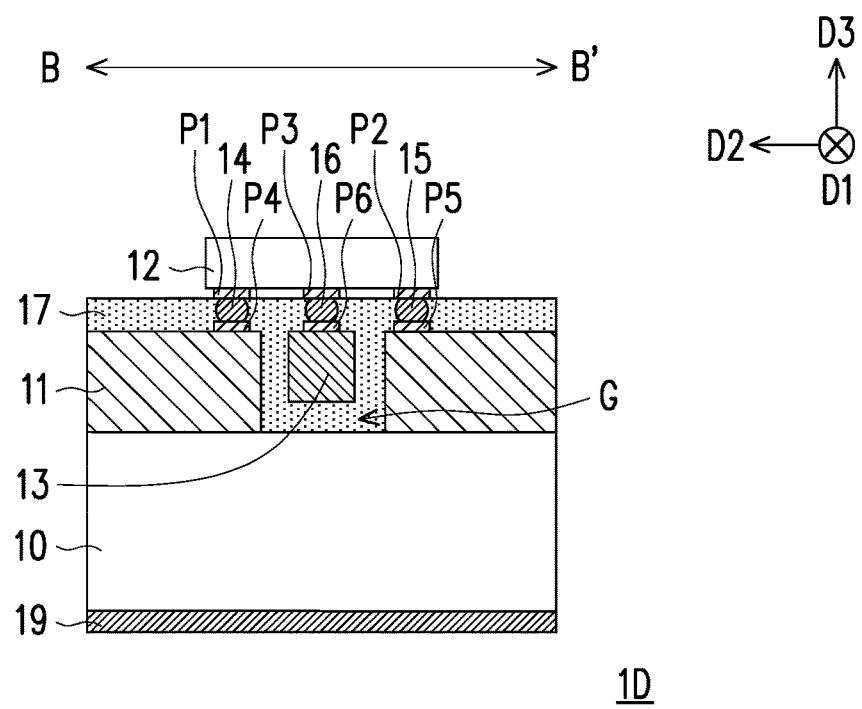

FIG. 5A and FIG. 5B are respectively a partial top schematic view and a partial cross-sectional schematic view of an electronic device according to the fifth embodiment of the disclosure. In order to clearly show the relative arrangement relationship of some elements and/or film layers, FIG. 5A omits showing some elements and/or film layers of the electronic device. In addition, please refer to FIG. 5A for the cross-section of section line B-B' in FIG. 5B.

Referring to FIG. 5A and FIG. 5B, the main differences between an electronic device 1D and the electronic device 1C of FIG. 4A and FIG. 4B are described as follows. In the electronic device 1D, a plurality of conductive patterns 11 may be used as transmission lines, for example, and the electronic device 1D does not need to include the transmission line 18 in FIG. 4A and FIG. 4B.

In the present embodiment, electromagnetic waves may be transmitted via the plurality of conductive patterns 11, and the plurality of conductive patterns 11 may be connected to a DC reverse voltage. Under the architecture that the tunable elements 12 are variable capacitance elements formed by a liquid-crystal device, the plurality of conductive patterns 11 may be connected to a low-frequency AC signal. In addition, the electronic device 1D may further include a conductive layer 19. The conductive layer 19 is disposed on the substrate 10, and the substrate 10 is located between the conductive layer 19 and the plurality of conductive patterns 11. The conductive layer 19 is connected to the ground voltage, for example. The DC reverse voltage or low-frequency AC signal applied to the plurality of conductive patterns 11 may be controlled to allow electromagnetic waves in a specific frequency range to pass and to filter electromagnetic waves in other frequency ranges.

Figure 6:
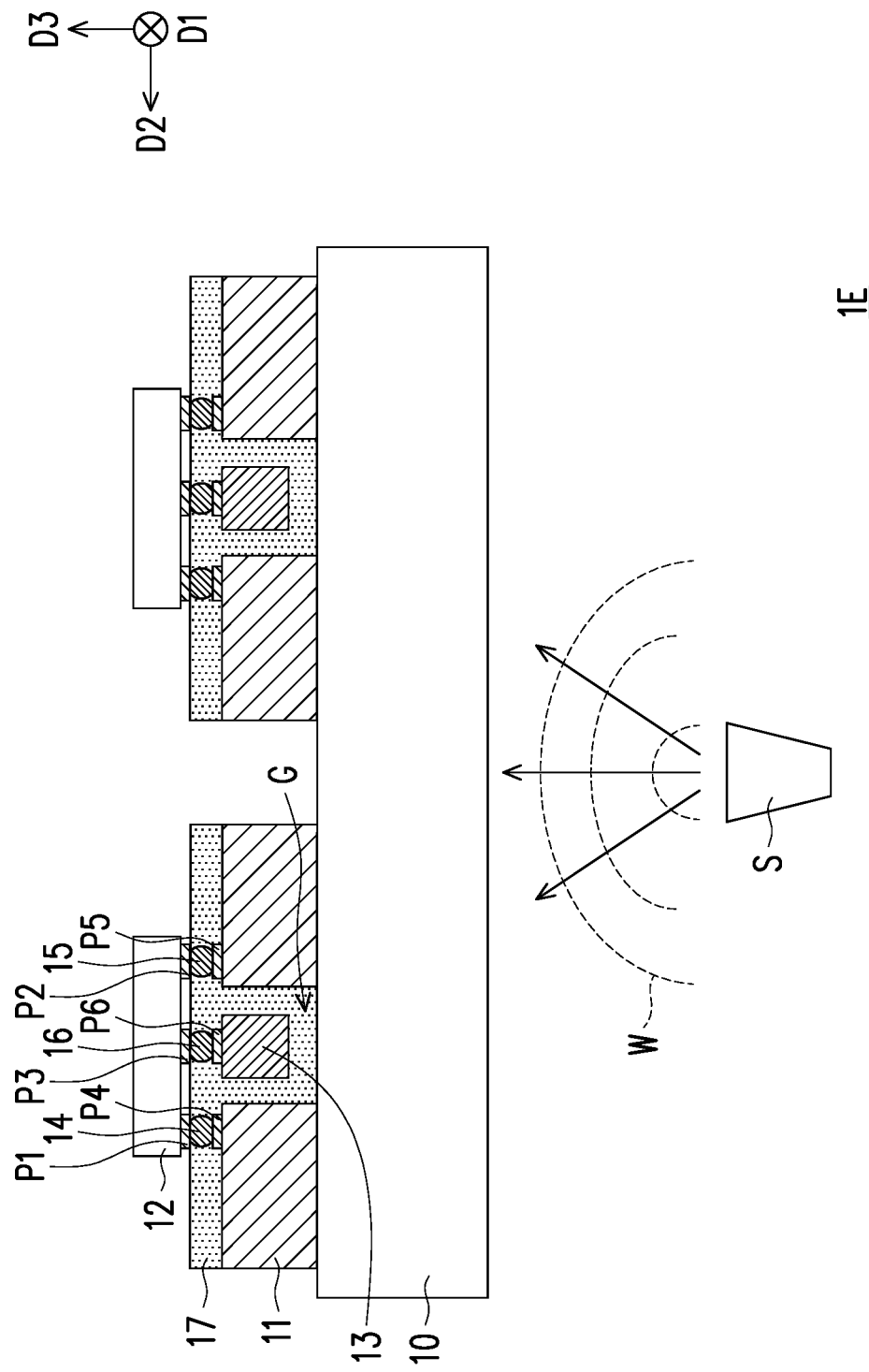
FIG. 6 to FIG. 8 are schematic partial cross-sectional views of electronic devices according to the sixth embodiment to the eighth embodiment of the disclosure, respectively.
Figure 7:
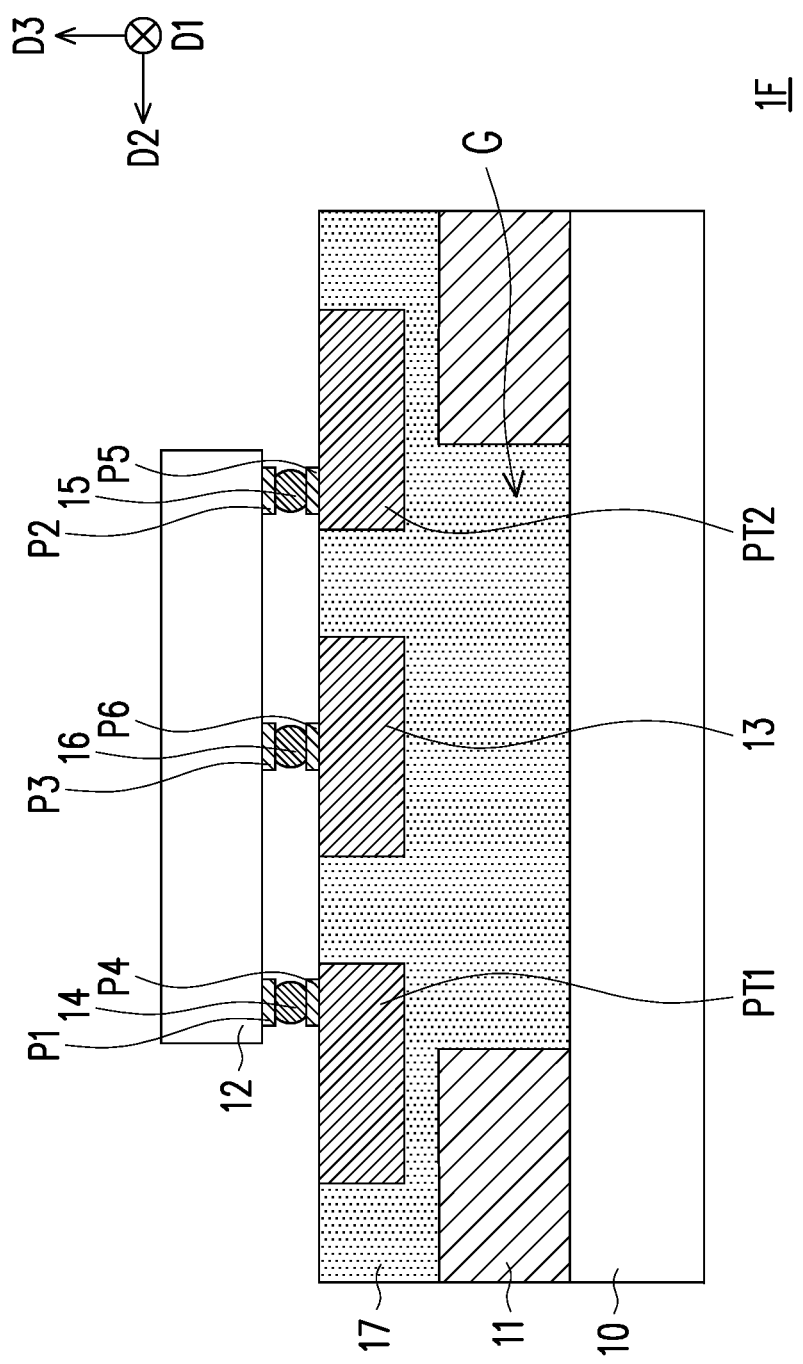
Figure 8:
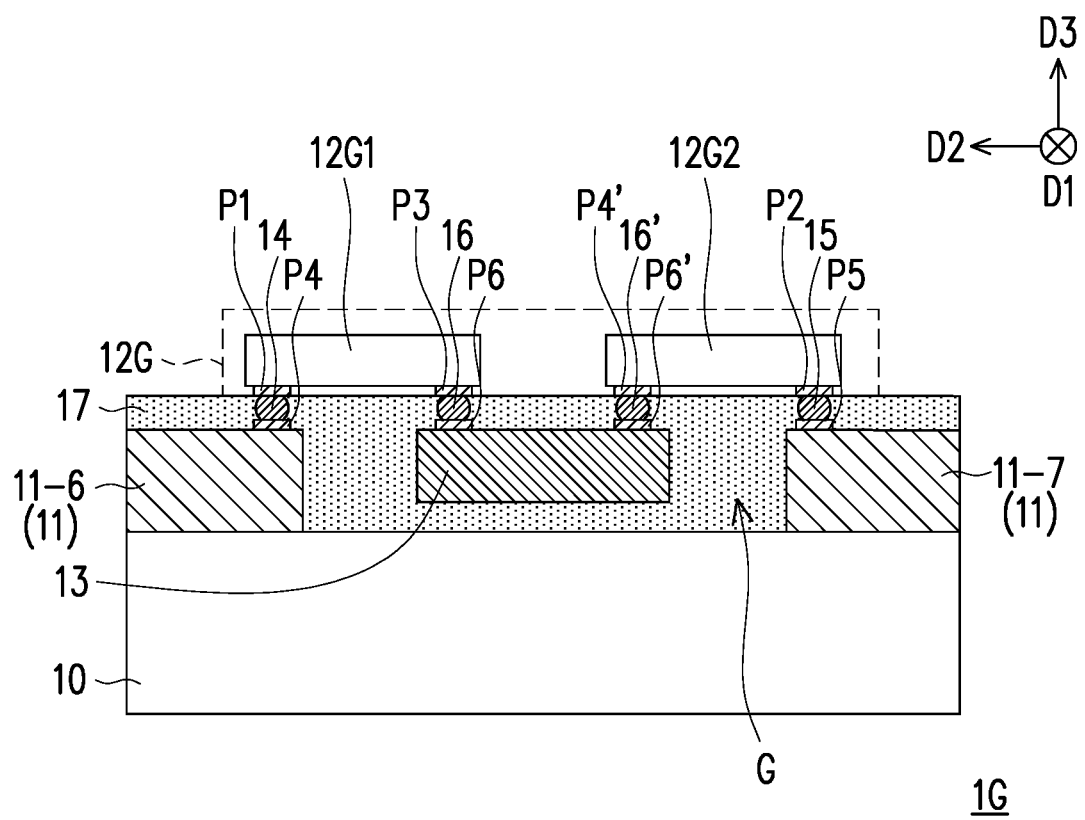

FIG. 6 to FIG. 8 are schematic partial cross-sectional views of electronic devices according to the sixth embodiment to the eighth embodiment of the disclosure, respectively.

Please refer to FIG. 6, the main differences between an electronic device 1E and the electronic device 1D of FIG. 5A and FIG. 5B are described as follows. In the electronic device 1E, an electromagnetic wave W from an excitation source S may be transmitted to the electronic device 1E via a free space. The transmission medium between the excitation source S and the electronic device 1E may be, for example, air, but the disclosure is not limited thereto. By changing the voltage applied to the tunable elements 12 via the conductive patterns 11 and the signal lines 13, the equivalent capacitance in the RF circuit may be controlled, so that the phase and amplitude of the electromagnetic wave are changed accordingly, and the direction of the electromagnetic wave is controlled or the directivity of the RF device is improved.

Please refer to FIG. 7, the main differences between an electronic device 1F and the electronic device 1E in FIG. 6 are described as follows. The electronic device 1F further includes a conductive pattern PT1 and a conductive pattern PT2. The conductive pattern PT1 and the conductive pattern PT2 are disposed on the plurality of conductive patterns 11, and the conductive pattern PT1, the conductive pattern PT2, and the plurality of conductive patterns 11 are separated from each other via the isolation layer 17. The pad P4 and the pad P5 are respectively disposed on the conductive pattern PT1 and the conductive pattern PT2. The material of the conductive pattern PT1 and the conductive pattern PT2 may include copper, aluminum, silver, gold, any material with high conductivity, or a combination of the above, but the disclosure is not limited thereto.

In some embodiments, the voltages applied to the conductive pattern PT1, the conductive pattern PT2, and the signal lines 13 may be different. In some embodiments, the conductive pattern PT1, the conductive pattern PT2, and the signal lines 13 may have different sizes. In some embodiments, the conductive pattern PT1, the conductive pattern PT2, and the signal lines 13 may or may not be overlapped with the conductive patterns 11 in the third direction D3. In some embodiments, the plurality of conductive patterns 11 may be of a first conductive layer, the conductive pattern PT1, the conductive pattern PT2, and the signal lines 13 may be of a second conductive layer, and the first conductive layer and the second conductive layer are separated by the isolation layer 17. In an embodiment in which the conductive pattern PT1, the conductive pattern PT2, and the signal lines 13 are of the second conductive layer, the conductive pattern PT1, the conductive pattern PT2, and the signal lines 13 may have the same material and may be formed by the same patterning process. In still other embodiments, the conductive pattern PT1, the conductive pattern PT2, and the signal lines 13 may be different layers, and may be formed by different processes.

Please refer to FIG. 8, the main differences between an electronic device 1G and the electronic device 1E in FIG. 6 are described as follows. In the electronic device 1G, a tunable element 12G includes, for example, a plurality of varactors, such as a varactor 12G1 and a varactor 12G2. The varactor 12G1 includes the first pad P1 and the third pad P3, wherein the first pad P1 is directly electrically connected to the pad P4 disposed on a conductive pattern 11-6 via the first solder 14, and the third pad P3 is directly electrically connected to the pad P6 disposed on the signal lines 13 via the third solder 16. The varactor 12G2 includes the second pad P2 and the fourth pad P4, wherein the second pad P2 is directly electrically connected to the pad P5 disposed on a conductive pattern 11-7 via the second solder 15, and the fourth pad P4 is directly electrically connected to a pad P6' disposed on the signal lines 13 via a fourth solder 16'.

In some embodiments, the varactor 12G1 and the varactor 12G2 may be packaged together using a technique such as panel-level packaging, wafer-level packaging, or fan-out wafer-level packaging. In other embodiments, the varactor 12G1 and the varactor 12G2 may also be changed to variable capacitors formed by liquid-crystal devices, microelectromechanical systems, or the like, but the disclosure is not limited thereto.

In some embodiments, the tunable element 12G may be, for example, a package of any combination of capacitors, resistors, inductors, diodes, transistors, etc., but the disclosure is not limited thereto. For example, the tunable element 12G may be a package (not shown) including a capacitor and a transistor.

Figure 9:
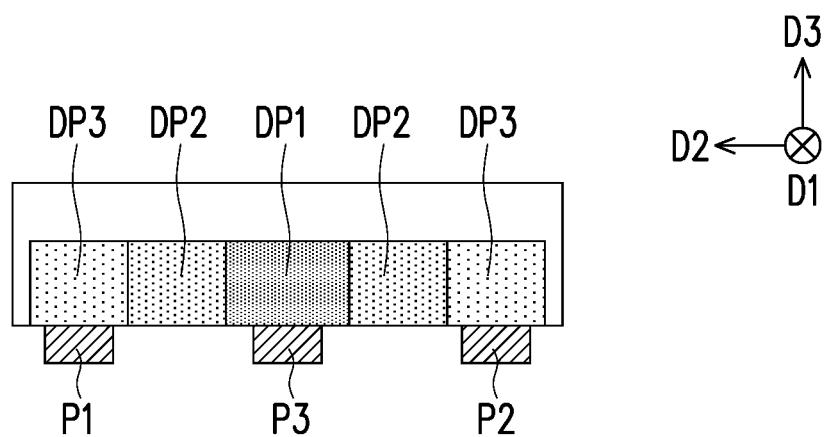
FIG. 9 is a schematic partial cross-sectional view of a tunable element according to one embodiment of the disclosure.

FIG. 9 is a schematic partial cross-sectional view of a tunable element according to one embodiment of the disclosure. Please refer to FIG. 9, a tunable element 12H may have 3 or more pads, such as the first pad P1, the second pad P2, and the third pad P3. In addition, the tunable element 12H may be manufactured by a semiconductor process (such as an ion doping process). For example, the tunable element 12H may have a first doped region DP1, a second doped region DP2, and a third doped region DP3, wherein the second doped region DP2 is disposed between the first doped region DP1 and the third doped region DP3. The third pad P3 is in contact with the first doped region DP1, for example, and the first pad P1 and the second pad P2 are in contact with the third doped region DP3, for example.

The first doped region DP1 and the second doped region DP2 are, for example, first-type doped regions, and the third doped region DP3 is, for example, a second-type doped region. Taking 2P1N+ as an example, the first doped region DP1 and the second doped region DP2 are, for example, N-type doped regions, and the first doped region DP1 is a heavily-doped region; and the third doped region DP3 is, for example, a P-type doped region, but the disclosure is not limited thereto. In other embodiments, the tunable element may also be 2N+1P. Under this architecture, the first doped region DP1 is, for example, a P-type doped region; and the second doped region DP2 and the third doped region DP3 are, for example, N-type doped regions, and the third doped region DP3 is, for example, a heavily-doped region, but the disclosure is not limited thereto.

Figure 10:
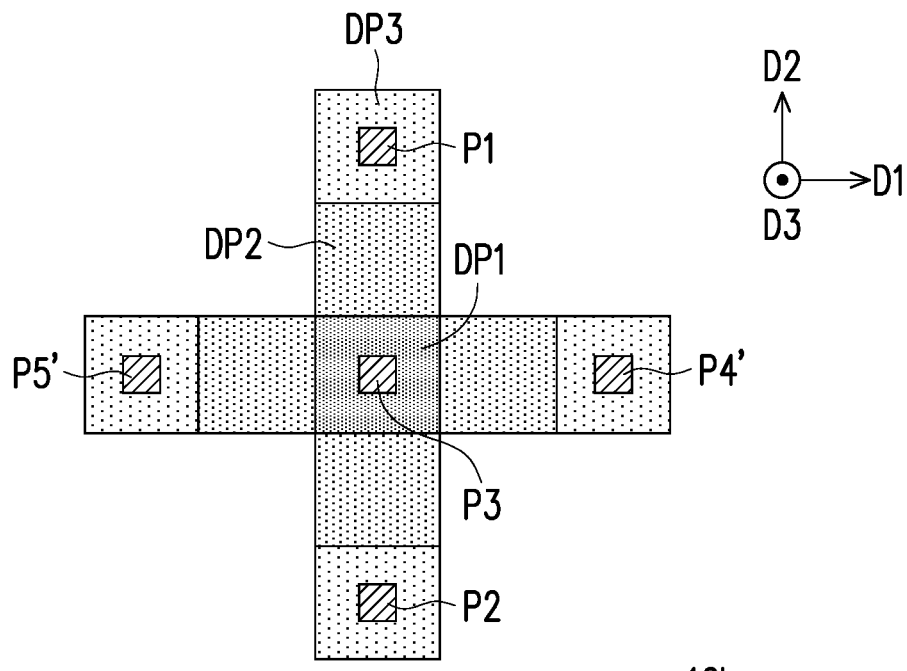
FIG. 10 is a schematic partial top view of a tunable element according to another embodiment of the disclosure.

In other embodiments, the tunable element may also be a 3P1N+(not shown), 3N+1P (not shown), 4P1N+(please refer to FIG. 10) architecture, or the like. FIG. 10 is a schematic partial top view of a tunable element according to another embodiment of the disclosure. Referring to FIG. 10, a tunable element 12I may have, for example, one first doped region DP1, four second doped regions DP2, and four third doped regions DP3, wherein one second doped region DP2 is disposed between each of the third doped regions DP3 and the first doped region DP1. In addition to the first pad P1, the second pad P2, and the third pad P3, the tunable element 12I may also include a fourth pad P4' and a fifth pad P5', wherein the first pad P1, the second pad P2, the fourth pad P4', and the fifth pad P5' are respectively disposed on four third doped regions DP3.

Figure 11:
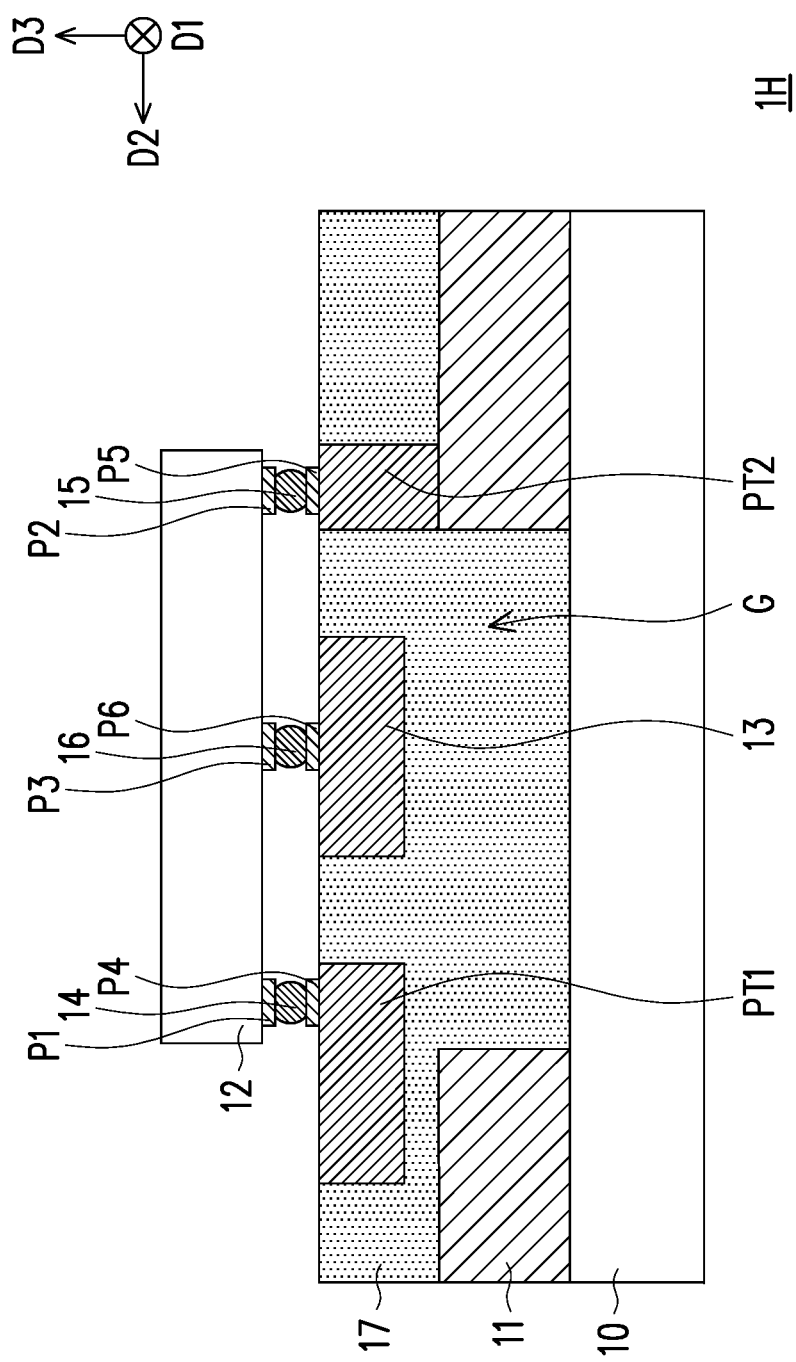
FIG. 11 is a schematic partial cross-sectional view of an electronic device according to the ninth embodiment of the disclosure.

FIG. 11 is a schematic partial cross-sectional view of an electronic device according to the ninth embodiment of the disclosure. Please refer to FIG. 11, the main differences between an electronic device 1H and the electronic device 1F in FIG. 7 are described as follows. In the electronic device 1H, the conductive pattern PT2 is connected to the pad P5 and the corresponding conductive pattern 11, so that the pad P5 is directly electrically connected to the corresponding conductive pattern 11 via the conductive pattern PT2, but the disclosure is not limited thereto.

It should be understood that, there may be different combinations of the connection means of the pads (such as the pad P1, the pad P2, and the pad P3) of the tunable elements 12 and the surrounding conductive patterns (such as the conductive pattern PT1, the conductive pattern PT2, the conductive patterns 11) or the signal lines (such as the signal lines 13). In some embodiments, all three pads need not be connected to conductive patterns or signal lines, and each pad may have an independent connection object and/or method. For example, the three pads may not be connected to any conductive pattern or signal line; or, the three pads may be connected to the conductive patterns; alternatively, the three pads may be connected to the signal lines; or, the three pads may be connected to the conductive patterns and the signal lines.

In addition, the tunable elements of the disclosure may be formed by different types of tunable or non-tunable elements (such as resistors, inductors, capacitors, thin-film transistors, μLEDs, diodes). FIG. 12 to FIG. 17 are respectively simple circuit diagrams of tunable elements according to a plurality of embodiments of the disclosure.

Figure 12:
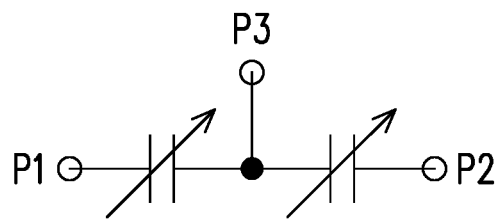
FIG. 12 to FIG. 17 are respectively simple circuit diagrams of tunable elements according to a plurality of embodiments of the disclosure.

In some embodiments, as shown in FIG. 12, a tunable element 12J may include two variable capacitors, wherein the pad P1 and the pad P3 are respectively connected to two opposite ends of one of the variable capacitors, and the pad P3 and the pad P2 are respectively connected to two opposite ends of another variable capacitor.

Figure 13:
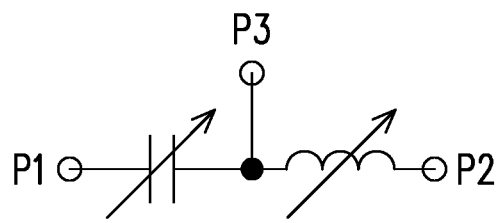

In some embodiments, as shown in FIG. 13, a tunable element 12K may include a variable capacitor and a variable inductor, wherein the pad P1 and the pad P3 are respectively connected to two opposite ends of the variable capacitor, and the pad P3 and the pad P2 are respectively connected to two opposite ends of the variable inductor.

Figure 14:
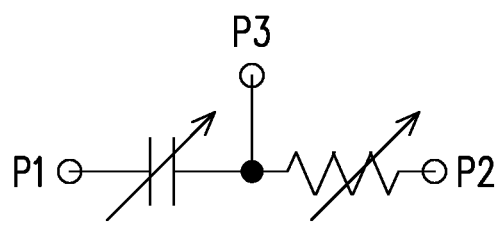

In some embodiments, as shown in FIG. 14, a tunable element 12L may include a variable capacitor and a variable resistor, wherein the pad P1 and the pad P3 are respectively connected to two opposite ends of the variable capacitor, and the pad P3 and the pad P2 are respectively connected to two opposite ends of the variable resistor.

Figure 15:
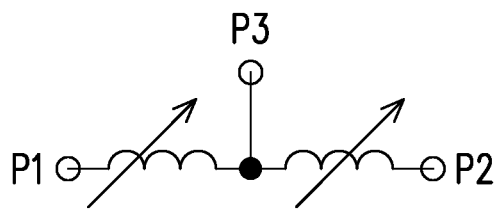

In some embodiments, as shown in FIG. 15, a tunable element 12M may include two variable inductors, wherein the pad P1 and the pad P3 are respectively connected to two opposite ends of one of the variable inductors, and the pad P3 and the pad P2 are respectively connected to two opposite ends of another variable inductor.

Figure 16:
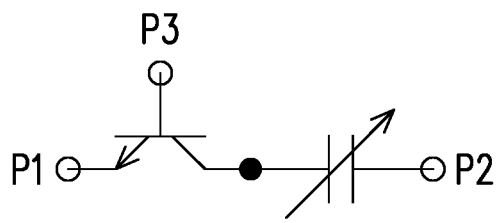

In some embodiments, as shown in FIG. 16, a tunable element 12N may include a thin-film transistor and a variable capacitor, wherein the pad P1 and the pad P3 are respectively connected to the drain and the gate of the thin-film transistor, and the source of the thin-film transistor and the pad P2 are respectively connected to two opposite ends of the variable capacitor. In some embodiments, the pad P1 and the pad P3 of the tunable element 12N may be respectively connected to the source and gate of the thin-film transistor, and the drain of the thin-film transistor and the pad P2 may be respectively connected to two opposite ends of the variable capacitor.

Figure 17:
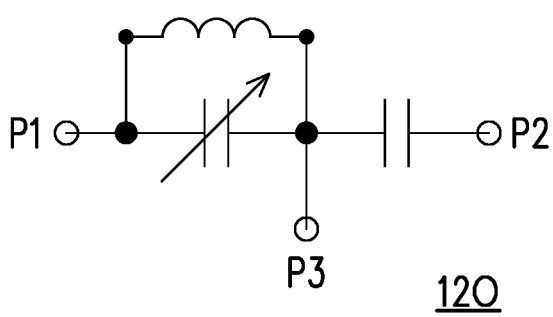

In some embodiments, as shown in FIG. 17, the tunable element 12O may include a capacitor, a variable capacitor connected in series with the capacitor, and an inductor connected in parallel with the variable capacitor, wherein the pad P1 and the pad P3 are respectively connected to two opposite ends of the variable capacitor, and the pad P3 and the pad P2 are respectively connected to two opposite ends of the capacitor.

In some embodiments, although not shown, a tunable element may include a capacitor and a variable capacitor, wherein the pad P1 and the pad P3 may be respectively connected to two opposite ends of the variable capacitor, and the pad P3 and the pad P2 are respectively connected to two opposite ends of the capacitor. In some embodiments, although not shown, the tunable element may include a resistor, an inductor, and a variable capacitor, wherein one end of the resistor, one end of the inductor, and one end of the variable capacitor are connected together, and the other end of the resistor, the other end of the inductor, and the other end of the variable capacitor may be connected to the pad P1, the pad P2, and the pad P3, respectively.

In some embodiments, the combination of different types of tunable or non-tunable elements (such as resistors, inductors, capacitors, thin-film transistors, μLEDs, diodes) may be integrated circuit chips or packages. The terminals of the tunable or non-tunable elements may be connected or electrically connected to the pads, but the disclosure is not limited thereto. For example, when the tunable element includes two variable capacitors and is an integrated circuit chip, the terminals of the variable capacitor may be connected to the pad, and the pads of the tunable element may be conductive bumps connected between the integrated circuit chip and a metal pattern or a signal line. Moreover, when the tunable element includes two variable capacitors and the two variable capacitors are formed into a package, the terminals of the variable capacitor may be connected to or electrically connected to the pads, and the pads of the tunable element may be conductive bumps connected between the package and a metal pattern or a signal line.

Figure 18:
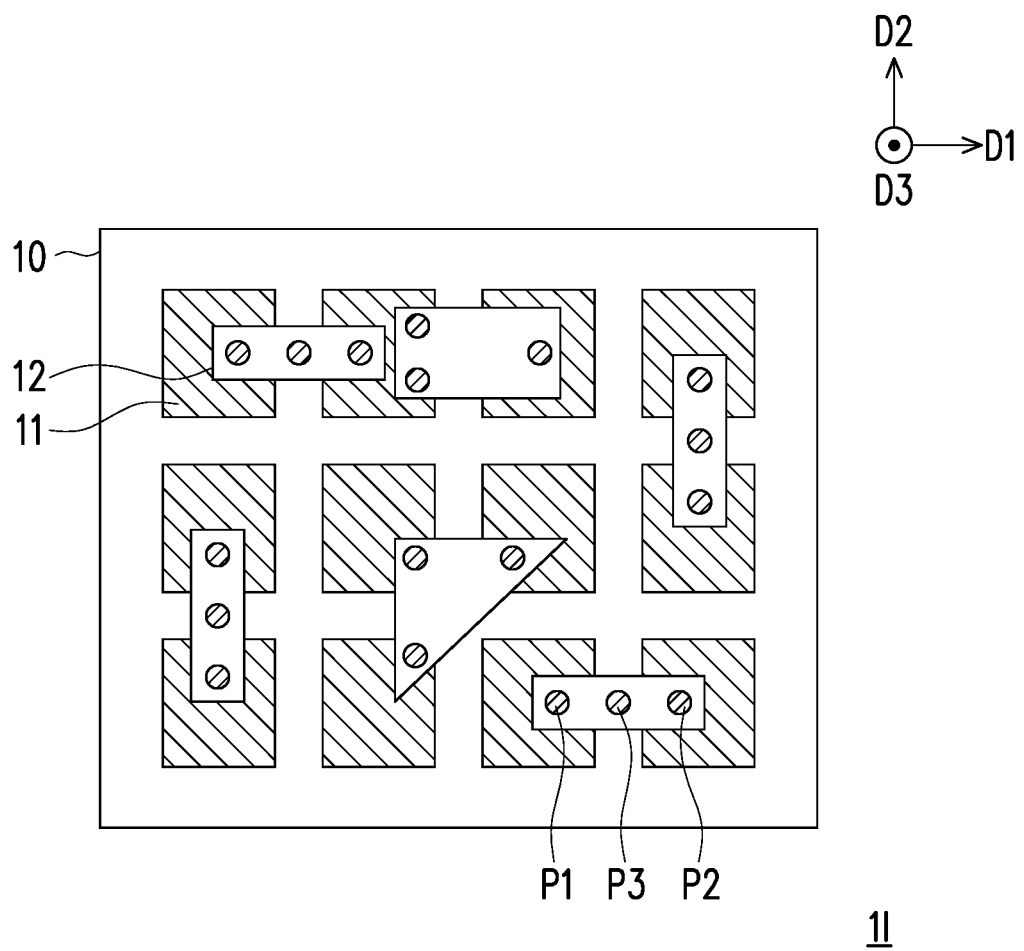
FIG. 18 and FIG. 19 are respectively partial schematic top views of tunable elements according to a plurality of embodiments of the disclosure.
Figure 19:
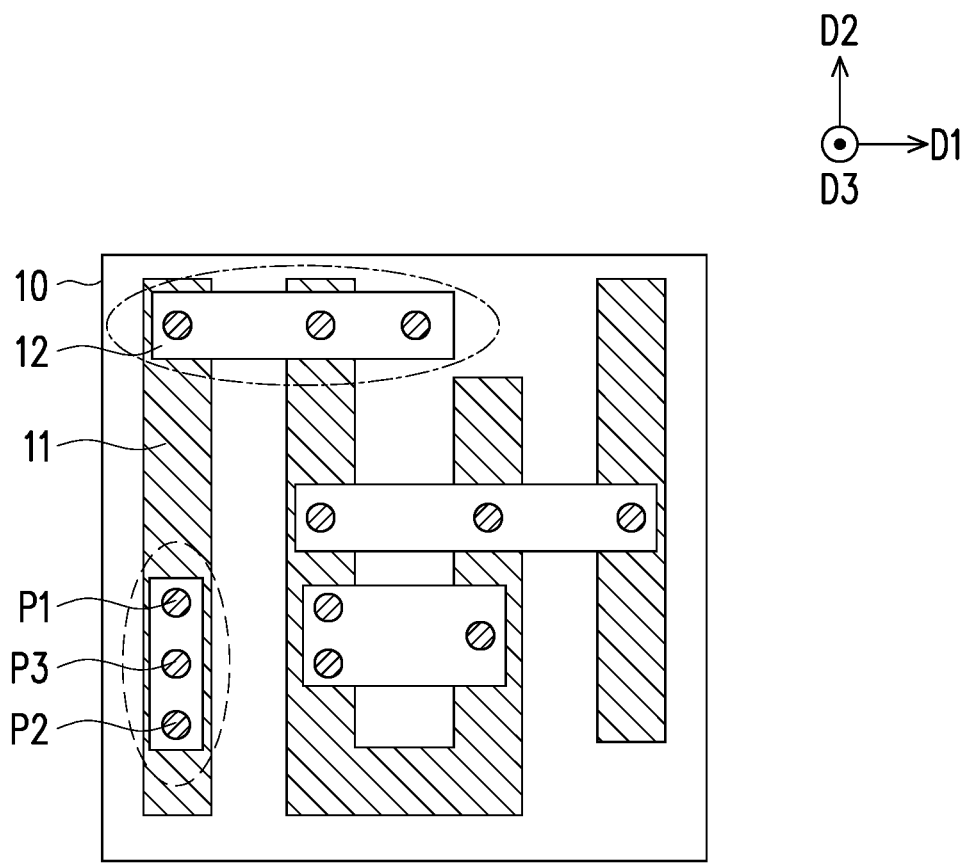

FIG. 18 and FIG. 19 are respectively partial schematic top views of tunable elements according to a plurality of embodiments of the disclosure. In FIG. 18 and FIG. 19, the signal lines 13 are omitted. In some embodiments, the electrical signal may be transmitted to the tunable elements 12 via conductive patterns (such as the conductive patterns 11); alternatively, the electrical signal may be transmitted to the tunable elements 12 via the signal lines 13 (not shown); alternatively, a portion of the electrical signal may be transmitted to the tunable elements 12 via conductive patterns (such as the conductive patterns 11), and a portion of the electrical signal may be transmitted to the tunable elements 12 via the signal lines 13 (not shown). In this way, the tunable elements 12 are driven or the characteristics of the signal (such as light intensity, polarization, electromagnetic wave direction, waveform, or RF characteristics) are changed. Specifically, the electrical length of an object is defined as physical length/wavelength. Therefore, under different wavelengths, even if the pitch of the conductive patterns 11 is the same, the electrical length is different. Via the signal modulation of the signal lines (not shown), the characteristics of the radio frequency of different wavelengths are also different.

FIG. 18 and FIG. 19 show two combinations of the connection means of three pads (such as the pad P1, the pad P2, and the pad P3) of the tunable elements 12 and the surrounding conductive patterns (such as the conductive patterns 11) or the signal lines 13 (not shown).

In some embodiments, the three pads of the tunable elements 12 do not need to all be connected to the conductive patterns. In addition, the three pads may be connected to the same conductive pattern 11 or different conductive patterns 11. As shown in FIG. 18, two of the three pads may be connected to one conductive pattern 11, and the remaining one of the three pads may be connected to another conductive pattern 11; alternatively, the three pads may be connected to three different conductive patterns 11 respectively; alternatively, two of the three pads may be connected to two adjacent conductive patterns 11, and the remaining one of the three pads may be connected to a signal line not shown. As shown in the dot chain frame of FIG. 19, two of the three pads may be connected to two adjacent conductive patterns 11, and the remaining one of the three pads does not need to be connected to the conductive patterns 11.

When the tunable elements 12 are formed by resistors or inductors, the tunable elements 12 do not necessarily need to be connected across different conductive patterns 11 to adjust the signal characteristics. In this case, as shown by the dashed frame of FIG. 19, three pads may be connected to the same conductive pattern 11, and the three pads may be electrically connected to signal lines not shown. Based on the above, in an embodiment of the disclosure, the design of the three pads of the tunable elements helps to increase the flexibility of circuit design, increase tunable RF parameters (such as radiation intensity, resonance frequency, or phase), or adjust the transmission direction of electromagnetic waves. In some embodiments, the tunable elements may include variable capacitors. By changing the voltage applied to the variable capacitors, the equivalent capacitance in the RF circuit may be controlled, so that the phase and amplitude of the electromagnetic waves are changed accordingly, and the direction of the electromagnetic waves is controlled or the directivity of the RF device is improved.

The above embodiments are used to describe the technical solution of the disclosure instead of limiting it. Although the disclosure has been described in detail with reference to each embodiment above, those having ordinary skill in the art should understand that the technical solution recited in each embodiment above may still be combined or modified, or some or all of the technical features thereof may be equivalently replaced. These combinations, modifications, or replacements do not make the essence of the corresponding technical solutions depart from the scope of the technical solution of each embodiment of the disclosure.

Although the embodiments of the disclosure and advantages thereof are disclosed as above, it should be understood that, any person having ordinary knowledge in the art may make changes, substitutions, and modifications without departing from the spirit and scope of the disclosure. In addition, the features between the embodiments may be mixed and replaced arbitrarily to form other new embodiments. Moreover, the scope of the disclosure is not limited to the manufacturing processes, machines, manufactures, material compositions, devices, methods, and steps in the specific embodiments described in the specification. Any person having ordinary skill in the art may understand the current or future development processes, machines, manufactures, material compositions, devices, methods, and steps from the contents of the disclosure, which may all be used according to the disclosure as long as substantially the same functions may be implemented in the embodiments described herein or substantially the same results may be obtained. Therefore, the scope of the disclosure includes the above manufacturing processes, machines, manufacture, material compositions, devices, methods, and steps. In addition, each claim constitutes an individual embodiment, and the scope of the disclosure also includes the combination of each claim and embodiment. The scope of the disclosure shall be subject to those defined by the appended claims.

What is claimed is:

1. An electronic device, comprising:
a substrate;
a plurality of conductive patterns disposed on the substrate;
a tunable element disposed on at least one conductive pattern in the plurality of conductive patterns and comprising a first pad, a second pad, and a third pad;
a signal line disposed on the substrate and electrically connected to the third pad of the tunable element; and
an isolation layer disposed on the substrate, wherein the plurality of conductive patterns are separated from each other via the isolation layer,
wherein the first pad, the second pad, and the third pad are separated from each other, the first pad and the second pad are overlapped with two conductive patterns in the plurality of conductive patterns, and the third pad is disposed between the first pad and the second pad,
wherein a gap is formed between the two conductive patterns in the plurality of the conductive patterns and the signal line is disposed in the gap,
wherein the plurality of conductive patterns restrict an output area of an electromagnetic wave transmitted under the plurality of conductive patterns.

2. The electronic device of claim 1, wherein the tunable element is disposed to traverse the gap.

3. The electronic device of claim 1, further comprising:
a first solder and a second solder, wherein the first pad is directly electrically connected to one of the two conductive patterns via the first solder, and the second pad is directly electrically connected to the other one of the two conductive patterns via the second solder.

4. The electronic device of claim 1, further comprising:
a transmission line disposed on the substrate, and the substrate is located between the transmission line and the plurality of conductive patterns.

5. The electronic device of claim 1, wherein the plurality of conductive patterns are used as transmission lines.

6. The electronic device of claim 5, further comprising:
a conductive layer disposed on the substrate, and the substrate is located between the conductive layer and the plurality of conductive patterns.

7. The electronic device of claim 1, further comprising:
a conductive layer disposed on the substrate, and the substrate is located between the conductive layer and the plurality of conductive patterns, wherein the conductive layer is connected to a ground voltage.

8. The electronic device of claim 1, wherein the tunable element comprises a plurality of variable capacitors each being formed by a liquid-crystal device, a microelectromechanical system, or the like.

9. The electronic device of claim 1, wherein the tunable element comprises three or more pads.

10. The electronic device of claim 1, wherein the electronic device is a radio frequency device.

11. The electronic device of claim 1, wherein the first pad, the second pad, and the third pad are respectively electrically connected to three different conductive patterns in the plurality of conductive patterns.

* * * * *